United States Patent
Kim et al.

(10) Patent No.: US 10,575,414 B2
(45) Date of Patent: Feb. 25, 2020

(54) DISPLAY APPARATUS AND APPARATUS AND METHOD OF MANUFACTURING THE SAME

(71) Applicant: Samsung Display Co., Ltd., Yongin-si, Gyeonggi-do (KR)

(72) Inventors: Jonghwan Kim, Yongin-si (KR); Inwon Jang, Yongin-si (KR); Sangurn Lim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/236,203

(22) Filed: Aug. 12, 2016

(65) Prior Publication Data
US 2017/0171989 A1    Jun. 15, 2017

(30) Foreign Application Priority Data
Dec. 15, 2015   (KR) .......................... 10-2015-0179203

(51) Int. Cl.
| | |
|---|---|
| *H05K 7/00* | (2006.01) |
| *H05K 5/00* | (2006.01) |
| *G06F 3/041* | (2006.01) |
| *H01L 27/32* | (2006.01) |
| *H01L 51/52* | (2006.01) |
| *H01L 51/56* | (2006.01) |
| *H05K 5/02* | (2006.01) |

(52) U.S. Cl.
CPC ........... *H05K 5/0017* (2013.01); *G06F 3/041* (2013.01); *H01L 27/323* (2013.01); *H01L 27/3244* (2013.01); *H01L 51/5237* (2013.01); *H01L 51/56* (2013.01); *H05K 5/0217* (2013.01)

(58) Field of Classification Search
CPC .... H05K 5/0017; H05K 5/0217; G06F 3/041; H01L 27/323; H01L 27/3244; H01L 51/5237; H01L 51/56; H01L 2251/5338
USPC .................................................. 361/728–730
See application file for complete search history.

(56) References Cited

U.S. PATENT DOCUMENTS

| | | | |
|---|---|---|---|
| 8,270,929 B1 | 9/2012 | Koeppel et al. | |
| 8,853,941 B2* | 10/2014 | Jung ...................... | G06F 1/1637 313/504 |
| 8,896,518 B2* | 11/2014 | Tanaka .................... | G09G 3/36 248/917 |
| 9,298,220 B2* | 3/2016 | Choi ...................... | G06F 1/1626 |
| 9,304,538 B2* | 4/2016 | Aaltonen ............... | G06F 1/1601 |
| 9,513,668 B2* | 12/2016 | Shin ........................ | G06F 3/041 |
| 9,525,012 B2* | 12/2016 | Lim ..................... | H01L 27/3244 |
| 9,578,149 B2* | 2/2017 | Moon .................. | H04M 1/0202 |
| 9,671,823 B2* | 6/2017 | Chang ................... | G06F 1/1626 |
| 9,842,886 B2* | 12/2017 | Song ..................... | H01L 27/3211 |

(Continued)

FOREIGN PATENT DOCUMENTS

| | | |
|---|---|---|
| KR | 10-2012-0100285 A | 9/2012 |
| KR | 10-2013-0087722 A | 8/2013 |

(Continued)

*Primary Examiner* — Hung S. Bui
(74) *Attorney, Agent, or Firm* — Lewis Roca Rothgerber Christie LLP

(57) ABSTRACT

Provided are a display apparatus, and an apparatus and method of manufacturing the same. The display apparatus includes a display module with round side surfaces, a bracket on the display module, and a main body connected to the bracket.

5 Claims, 7 Drawing Sheets

(56) References Cited

U.S. PATENT DOCUMENTS

| | | | |
|---|---|---|---|
| 2013/0050948 A1* | 2/2013 | Kim | G06F 1/263 |
| | | | 361/715 |
| 2013/0194782 A1 | 8/2013 | Byun | |
| 2014/0016048 A1* | 1/2014 | Omote | G06F 3/044 |
| | | | 349/12 |
| 2014/0176849 A1* | 6/2014 | Lee | G02F 1/133308 |
| | | | 349/58 |
| 2015/0331451 A1* | 11/2015 | Shin | G06F 3/041 |
| | | | 345/173 |
| 2016/0227654 A1* | 8/2016 | Kim | G06F 1/16 |
| 2016/0268523 A1* | 9/2016 | Kim | H01L 51/529 |
| 2016/0364075 A1* | 12/2016 | Mizuno | G06F 1/1626 |

FOREIGN PATENT DOCUMENTS

| | | |
|---|---|---|
| KR | 10-2014-0083675 A | 7/2014 |
| KR | 10-2014-0092299 A | 7/2014 |
| KR | 10-2014-0142104 A | 12/2014 |

\* cited by examiner

DISPLAY APPARATUS AND APPARATUS AND METHOD OF MANUFACTURING THE SAME

CROSS-REFERENCE TO RELATED APPLICATION

This application claims priority to, and the benefit of, Korean Patent Application No. 10-2015-0179203, filed on Dec. 15, 2015 in the Korean Intellectual Property Office, the disclosure of which is incorporated herein in its entirety by reference.

BACKGROUND

1. Field

Embodiments of the present disclosure relate to display apparatuses and methods of manufacturing the same.

2. Description of the Related Art

Portable electronic devices have been widely used. Recently, tablet personal computers (PCs) have come into wide use along with small electronic devices, such as mobile phones.

A portable electronic device may include a display apparatus that supports various functions, or that provides a user with visual information, such as an image or a moving image. As components for driving display apparatuses have decreased in size, the importance of the display apparatuses in electronic devices has increased. A structure for bending a display apparatus from a flat state to a certain angle has been developed.

SUMMARY

When an existing display apparatus includes a window having a curved portion, the strength of a flat portion of the window may degrade when the existing display apparatus is dropped. One or more embodiments include a display apparatus having a flat portion with improved strength, and also include an apparatus for, and method of, manufacturing the display apparatus.

Additional aspects will be set forth in part in the description that follows and, in part, will be apparent from the description, or may be learned by practice of the presented embodiments.

According to one or more embodiments, a display apparatus includes a display module with round side surfaces, a bracket on the display module, and a main body connected to the bracket.

The display module may include a window with round side surfaces, and a display panel on the window.

The display module may further include a touch screen on the window or on the display panel.

The display module may further include a cushion part between the display panel and the bracket.

The bracket may include a bracket body under the display panel, and a connection part on the bracket body.

The display apparatus may further include an adhesive member between the bracket and the display panel.

According to one or more embodiments, a manufacturing apparatus for manufacturing a display apparatus, the manufacturing apparatus including a second stage for supporting a display module, and defining an opening, a first stage for supporting a bracket in the opening of the second stage, and configured to move relative to the second stage, and a force applicator separate from the first and second stages for selectively contacting the display module.

The manufacturing apparatus may further include a linear driver connected to the force applicator for linearly moving the force applicator.

The manufacturing apparatus may further include a stage driver connected to at least one of the first and second stages for moving the first and second stages relative to each other.

The second stage may be configured to descend when the force applicator applies force to the display module.

A portion of the force applicator for contacting the display module may include an elastic material.

The force applicator may be configured to selectively apply force to a central portion of the display module.

A portion of the force applicator for contacting the display module may be flat.

The bracket may include a bracket body, and a connection part connected to the bracket body, and the first stage may include a fixture part for connecting to the connection part and for holding the bracket body in place.

According to one or more embodiments, a method of manufacturing a display apparatus, the method including positioning a bracket on a first stage, positioning a display module having curved side surfaces on a second stage that is stepped with respect to the first stage, and positioning the bracket within the display module while applying force with a force applicator to the display module to cause the curved side surfaces of the display module to move in opposite directions.

The method may further include moving the first and second stages relative to each other such that an upper surface of the second stage is lower than an upper surface of the first stage when applying force to the display module with the force applicator.

The method may further include fixing the bracket to the display module by sequentially adhering the bracket to the display module from a portion of the display module to side surfaces of the display module to fix the bracket to the display module.

An adhesive member may be located between the bracket and the display module.

The method may further include connecting the display module to the bracket by separating the force applicator from the display module.

A portion of the force applicator for contacting the display module may include an elastic material.

BRIEF DESCRIPTION OF THE DRAWINGS

These and/or other aspects will become apparent and more readily appreciated from the following description of the embodiments, taken in conjunction with the accompanying drawings, in which.

DETAILED DESCRIPTION

Figure 1:
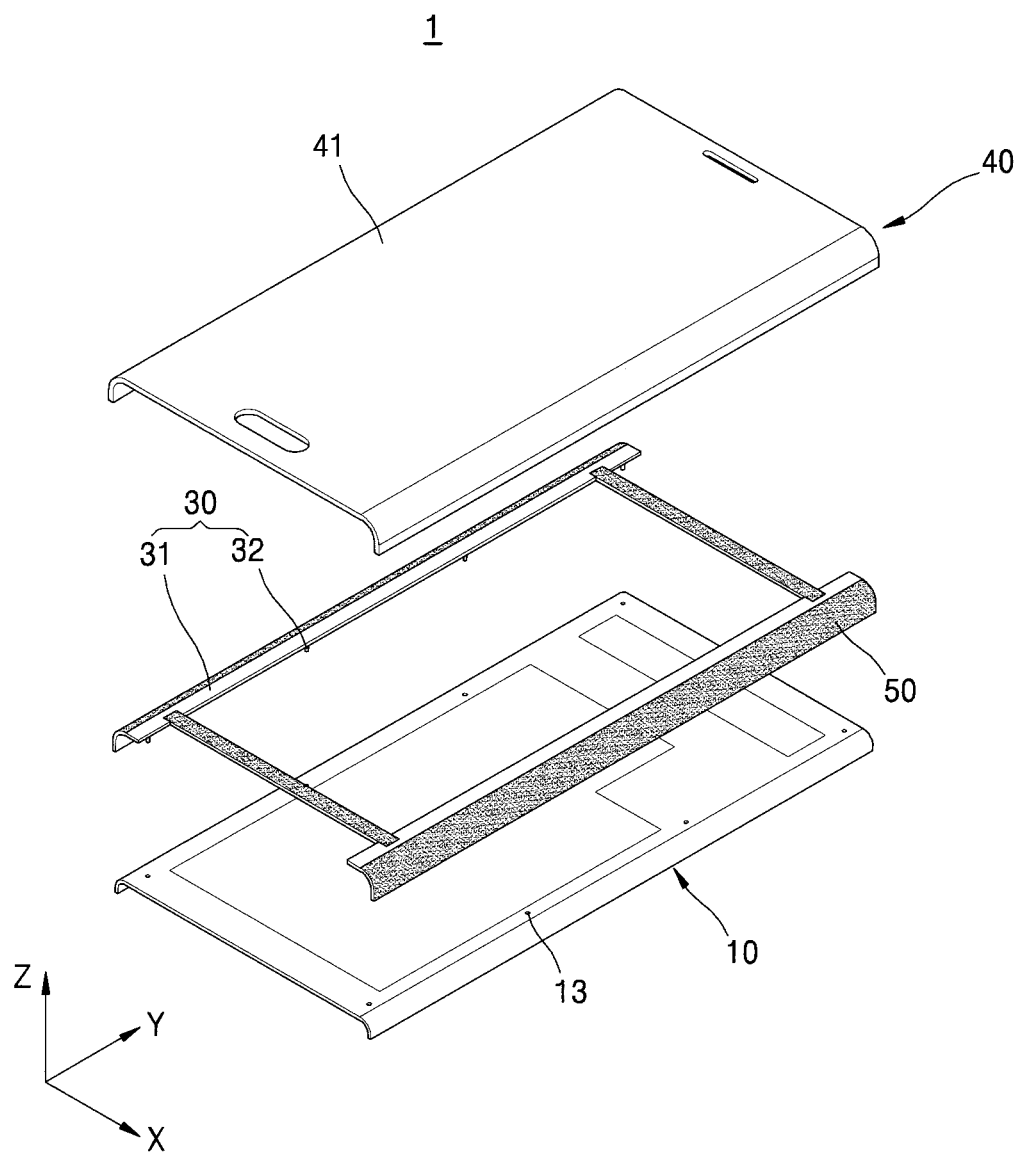
FIG. 1 is an exploded perspective view of a portion of a display apparatus according to an embodiment.

Features of the inventive concept and methods of accomplishing the same may be understood more readily by reference to the following detailed description of embodiments and the accompanying drawings. Hereinafter, example embodiments will be described in more detail with reference to the accompanying drawings, in which like reference numbers refer to like elements throughout. The present invention, however, may be embodied in various different forms, and should not be construed as being limited to only the illustrated embodiments herein. Rather, these embodiments are provided as examples so that this disclosure will be thorough and complete, and will fully convey the aspects and features of the present invention to those skilled in the art. Accordingly, processes, elements, and techniques that are not necessary to those having ordinary skill in the art for a complete understanding of the aspects and features of the present invention may not be described. Unless otherwise noted, like reference numerals denote like elements throughout the attached drawings and the written description, and thus, descriptions thereof will not be repeated. In the drawings, the relative sizes of elements, layers, and regions may be exaggerated for clarity.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present invention.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that when an element or layer is referred to as being "on," "connected to," or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments only and is not intended to be limiting of the present invention. As used herein, the singular forms "a," "an," and "the" are intended to include the plural forms as well, unless the context clearly indicates otherwise. It will be further understood that the terms "comprises," "comprising," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the term "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present invention refers to "one or more embodiments of the present invention." As used herein, the terms "use," "using," and "used" may be considered synonymous with the terms "utilize," "utilizing," and "utilized," respectively. Also, the term "exemplary" is intended to refer to an example or illustration.

The electronic or electric devices and/or any other relevant devices or components according to embodiments of the present invention described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the exemplary embodiments of the present invention.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Figure 2:
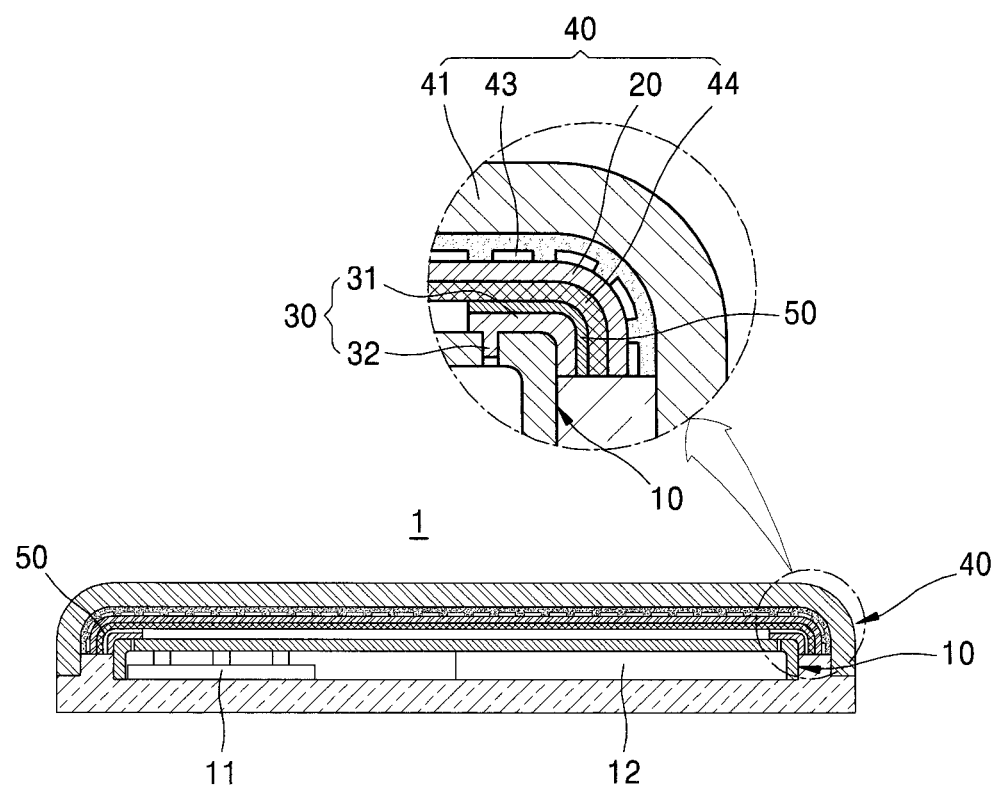
FIG. 2 is a cross-sectional view of a display module of FIG. 1.
Figure 3:
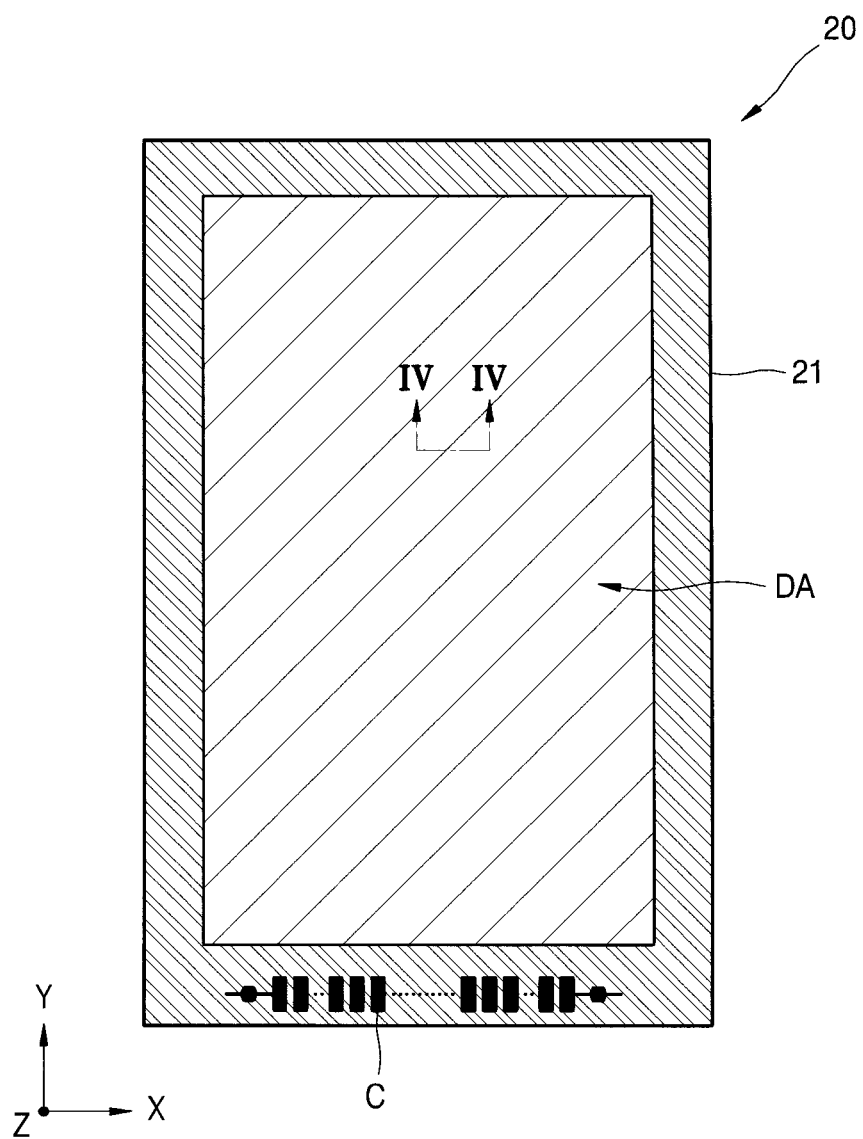
FIG. 3 is a plan view of a display panel of FIG. 2.
Figure 4:
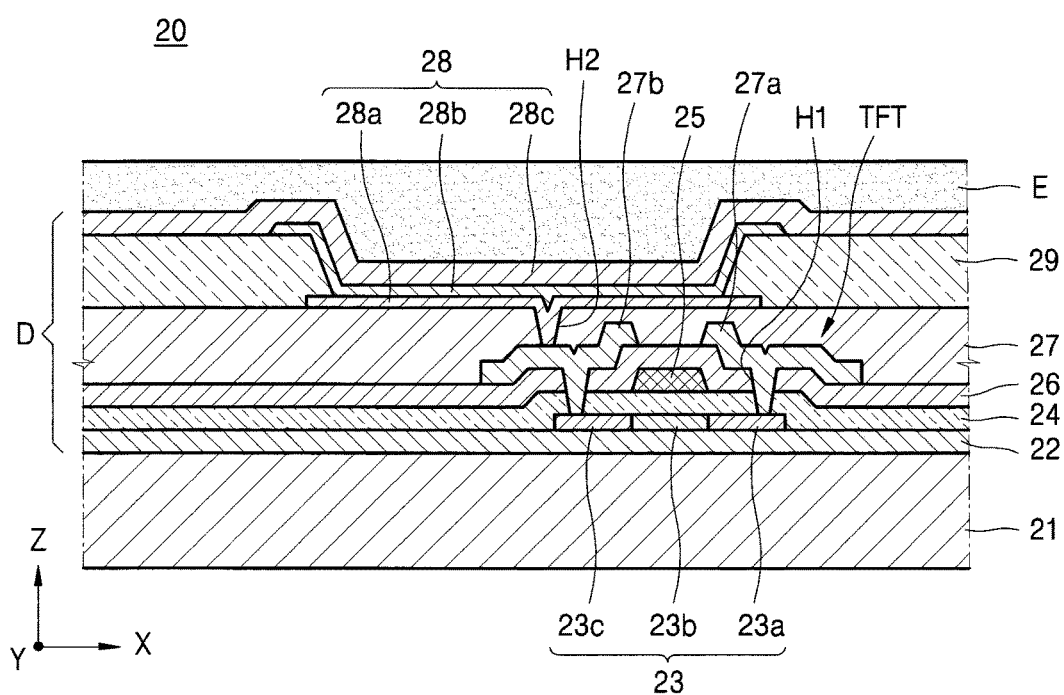
FIG. 4 is a cross-sectional view taken along the line IV-IV of FIG. 3.

FIG. 1 is an exploded perspective view of a portion of a display apparatus 1 according to an embodiment, FIG. 2 is a cross-sectional view of a display module 40 of FIG. 1, FIG. 3 is a plan view of a display panel 20 of FIG. 2, and FIG. 4 is a cross-sectional view taken along the line IV-IV of FIG. 3.

Referring to FIGS. 1 to 4, the display apparatus 1 may include a main body 10, a bracket 30, the display module 40, and an adhesive member 50.

A metallic material, a circuit board 11, a battery 12, and the like may be installed within the main body 10. The side surfaces of the main body 10 may be round (e.g., curved away from a plane of a flat portion of the main body 10). Also, a central portion of the main body 10 may be flat.

The bracket 30 may be installed above the main body 10. In this case, the bracket 30 may connect the display module 40 and the main body 10. Also, the bracket 30 may support the display module 40 to reinforce the strength of the display module 40.

The bracket 30 may include a bracket body 31 and a connection part 32. The bracket body 31 may be in a grid form, and a central portion of the bracket body 31 may be open (e.g., the bracket body 31 may define an opening at a central portion thereof). Also, portions of side surfaces of the bracket body 31 may be round (e.g., in a manner similar to the side surfaces of the main body 10). The round portions of the side surfaces may be symmetrical to each other with respect to the central portion of the bracket body 31. For example, the round side surfaces of the bracket body 31 may be in a lengthwise direction of the bracket body 31. Also, a central portion of the bracket body 31, or portions adjacent the central portion of the bracket body 31, may be flat.

The connection part 32 may be at the bracket body 31, and may protrude through, or into, the main body 10. For example, the connection part 32 may be a protrusion that is inserted into the main body 10. Also, the main body 10 may include a separate groove/hole 13 in which the connection part 32 may be inserted.

There may be multiple connection parts 32 that are spaced apart from each other. Also, the connection parts 32 may be at the flat portion of the bracket body 31, and may be configured to be inserted into the main body 10.

A method of connecting the bracket 30 to the main body 10 may vary. For example, the bracket 30 may be connected to the main body 10 by an adhesive material, such as an adhesive between the bracket 30 and the main body 10. In another embodiment, the bracket 30 may be connected to the main body 10 by separate connection members, such as bolts and nuts, which may be located between the bracket 30 and the main body 10. Hereinafter, for purposes of illustration, the bracket 30 is connected to the main body 10 by screws.

The display module 40 may be located above the bracket 30. For example the display module 40 may include a window 41, a display panel 20, a touch screen 43, and a cushion part 44.

Side surfaces of the window 41 may be round, or curved, in a manner similar to the round side surfaces of the main body 10 and/or the bracket body 31. For example, a central portion of the window 41 may be flat. Also, the round side surfaces of the window 41 may be symmetrical to each other with respect to the central portion of the window 41. That is, a radius of curvature of an end/one of the side surfaces of the window 41 may be the same as a radius of curvature of the other end/side surface of the window 41.

The window 41 may include a transparent material. For example, the window 41 may include glass, transparent synthetic resin, such as acryl, or the like. Also, the window 41 may be a single layer, or may be multiple layers including a transparent material. A separate coating layer may be located at a surface of the window 41 to prevent cracks and stains therein, and to reinforce the strength of the window 41. Hereinafter, for purposes of illustration, a separate coating layer is omitted from the surface of the window 41.

The display panel 20 may be flexible. For example, the display panel 20 may totally adhere to the window 41, and may have the same shape as the window 41. As another example, a transparent adhesive material may be arranged between, and may connect, the display panel 20 and the window 41.

The touch screen 43 may be in various forms. For example, the touch screen 43 may be in a panel form, and may be located on the surface of the window 41, or may be located between the window 41 and the display panel 20. As another example, the touch screen 43 may be connected to any one of the window 41 and the display panel 20 by an adhesive material.

The touch screen 43 may be in a circuit pattern at an entirety of the display panel 20, or on a front or rear surface of the window 41. The touch screen 43 may be on the display panel 20 or on the window 41 in various manners.

Hereinafter, for illustrative purposes, the touch screen 43 may be located on an external surface of the display panel 20.

The cushion part 44 may be at a rear surface of the display panel 20 that is opposite the touch screen 43. For example, the cushion part 44 may be between the display panel 20 and the bracket 30.

The cushion part 44 may reinforce the strength of the window 41 and the display panel 20. For example, when external shock is applied to the window 41 and the display panel 20, the cushion part 44 may absorb the energy of the shock.

The cushion part 44 may be in a tape form, and may adhere to the display panel 20. For example, the cushion part 44 may adhere to the display panel 20 and to the adhesive member 50. In another embodiment, a portion of the cushion part 44 may adhere to the main body 10 and to the adhesive member 50. Hereinafter, for illustrative purposes, the cushion part 44 may adhere to the adhesive member 50.

The adhesive member 50 may include a transparent material, and may be between the display panel 20 and the bracket 30 (e.g., between the cushion part 44 and the bracket 30). For example, the adhesive member 50 may be in a tape form, and may connect the bracket 30 to the display panel 20/the cushion part 44. For example, the adhesive member 50 may completely cover a surface of the bracket 30.

Hereinafter, the display panel 20 will be described. Above a substrate 21, the display panel 20 may include a display area DA, and may include a non-display area surrounding the display area DA. As shown in FIG. 4, a light-emitting area D may be arranged above the display area DA, and a power wire may be arranged in the non-display area. Also, a pad area C may be arranged in the non-display area.

The display panel 20 may be flexible. For example, the display panel 20 may include the substrate 21 and the light-emitting area D. Also, the display panel 20 may include a thin film encapsulation layer E above the light-emitting area D.

The substrate 21 may include a plastic material or polyimide (PI). Hereinafter, for illustrative purposes, the substrate 21 includes PI.

The light-emitting area D may be above the substrate 21. For example, the light-emitting area D may include a thin film transistor TFT, a passivation layer 27 covering the thin film transistor TFT, and an organic light-emitting device (OLED) 28 above the passivation layer 27.

For example, the substrate 21 may include a glass material, although the material is not limited thereto. The substrate 21 may include a plastic material, or may include a metallic material such as SUS and Ti. Also, the substrate 21 may include PI. Hereinafter, for illustrative purposes, the substrate 21 includes a glass material.

A buffer layer 22 including an organic compound and/or an inorganic compound may also be above the substrate 21, and may include $SiO_x$ (x≥1) and/or $SiN_x$ (x≥1).

After an active layer 23 is placed above the buffer layer 22 in a certain pattern, the active layer 23 may be covered by a gate insulating layer 24. The active layer 23 may include a source area 23a and a drain area 23c with a channel area 23b therebetween.

The active layer 23 may include various materials. For example, the active layer 23 may include an inorganic semiconductor material, such as silicon (e.g., amorphous silicon or crystalline silicon). As another example, the active layer 23 may include an oxide semiconductor material. As another example, the active layer 23 may include an organic semiconductor material. Hereinafter, for the purposes of illustration, the active layer 23 may include amorphous silicon.

The active layer 23 may be an amorphous silicon layer that is formed above the buffer layer 22 by crystallizing the amorphous silicon layer into a crystalline silicon layer, and by then patterning the crystalline silicon layer. The source area 23a and the drain area 23c of the active layer 23 may be doped with impurities according to types of the thin film transistor TFT, such as whether the TFT is a driving TFT or a switching TFT.

A gate electrode 25 corresponding to the active layer 23, and an interlayer insulating layer 26 covering the gate electrode 25, are above the gate insulating layer 24.

A contact hole H1 may be in the interlayer insulating layer 26 and in the gate insulating layer 24. A source electrode 27a and a drain electrode 27b may be above the interlayer insulating layer 26 in such a manner that the source electrode 27a and the drain electrode 27b correspond to the source area 23a and the drain area 23c, respectively.

The passivation layer 27 may be above the thin film transistor TFT, and a pixel electrode 28a of the OLED 28 may be above the passivation layer 27. The pixel electrode 28a may contact the drain electrode 27b of the thin film transistor TFT via a via hole H2 in the passivation layer 27. The passivation layer 27 may include an inorganic material and/or an organic material, and may be a single layer or may be multiple layers. The passivation layer 27 may be a planarization layer that is flat over curved layers under the passivation layer 27, or may be curved along a curve of layers under the passivation layer 27. The passivation layer 27 may be a transparent insulator to achieve a resonance effect.

A pixel electrode 28a may be located above the passivation layer 27. A pixel-defining layer 29 may be on the passivation layer 27, and may cover part of the pixel electrode 28a, and thus may expose another part of the pixel electrode 28a. The pixel-defining layer 29 may include an organic material and/or an inorganic material.

An intermediate layer 28b and an opposite layer 28c may be above the pixel electrode 28a.

The pixel electrode 28a may function as an anode electrode, and the opposite electrode 28c may function as a cathode electrode. However, the polarities of the pixel electrode 28a and the opposite electrode 28c may be reversed. The pixel electrode 28a and the opposite electrode 28c may be insulated from each other by the intermediate layer 28b. Applying voltages having different polarities to opposite sides of the intermediate layer 28b may cause the organic emission layer to emit light.

The intermediate layer 28b may include the organic emission layer. In another example, the intermediate layer 28b may further include a hole injection layer (HIL), a hole transport layer (HTL), an electron transport layer (ETL), and/or an electron injection layer (EIL). However, the present disclosure is not limited thereto. The intermediate layer 28b may include the organic emission layer and may further include various functional layers.

For example, the intermediate layer 28b may be developed by an apparatus for manufacturing the aforementioned display apparatus.

One unit pixel may include sub-pixels that emit various light colors, respectively. For example, the sub-pixels may respectively emit red light, green light, and blue light, or may respectively emit red light, green light, blue light, and white light.

The thin film encapsulation layer E may include inorganic layers, or may include an inorganic layer and an organic layer.

The organic layer of the thin film encapsulation layer E may include a polymer, and may be a single layer or a stack of layers including any one of polyethylene terephthalate, PI, polycarbonate, epoxy, polyethylene, and/or polyacrylate. The organic layer may include polyacrylate and, more particularly, may include a polymerized monomer composite including a diacrylate-based monomer and a triacrylate-based monomer. The polymerized monomer composite may further include a monoacrylate-based monomer. Also, the monomer composite may further include a well-known photo initiator, such as 2,4,6-Trimethylbenzoyl-diphenyl-phosphineoxide (TPO), but the disclosure is not limited thereto.

The inorganic layer of the thin film encapsulation layer E may be a single layer or a stack layer including a metal oxide or a metal nitride. For example, the inorganic layer may include any one of $SiN_x$, $Al_2O_3$, $SiO_2$, and/or $TiO_2$.

An uppermost layer of the thin film encapsulation layer E that is exposed to the outside may be an inorganic layer to prevent moisture from penetrating into the OLED 28.

The thin film encapsulation layer E may include at least one sandwich structure wherein at least one organic layer is between at least two inorganic layers. As another example, the thin film encapsulation layer E may include at least one sandwich structure wherein at least one inorganic layer is between at least two organic layers. As another example, the thin film encapsulation layer E may include a sandwich structure wherein at least one organic layer is between at least two inorganic layers, and may also include a sandwich structure in which at least one inorganic layer is between at least two organic layers (e.g., alternating layers of organic layers and inorganic layers).

The thin film encapsulation layer E may sequentially include a first inorganic layer, a first organic layer, and a second inorganic layer from an upper portion of the OLED 28.

As another example, the thin film encapsulation layer E may sequentially include a first inorganic layer, a first organic layer, a second inorganic layer, a second organic layer, and a third inorganic layer from the upper portion of the OLED 28.

As another example, the thin film encapsulation layer E may sequentially include a first inorganic layer, a first organic layer, a second inorganic layer, a second organic layer, a third inorganic layer, a third organic layer, and a fourth inorganic layer from the upper portion of the OLED 28.

A halogenated metallic layer including LiF may be further included between the OLED 28 and the first inorganic layer. The halogenated metallic layer may prevent damage to the OLED 28 when the first inorganic layer is developed through sputtering.

The first organic layer may have a smaller area than the second inorganic layer, and the second organic layer may have a smaller area than the third inorganic layer.

The display module 40 may have certain degrees of strength. For example, the window 41 may have basic strength depending on the properties of materials of the window 41. Also, as the display panel 20 adheres to the window 41, the strength of the window 41 may be secured. In addition, the strength of the window 41 may be improved due to the cushion part 44 adhering to the display panel 20.

However, in the above case, when the display panel 20 is directly fixed to the main body 10 through the cushion part 44 and the adhesive member 50, impact applied to the window 41 may be effectively blocked, or dispersed, when the display apparatus 1 is dropped. For example, when a flat portion of the window 41 hits an external object when dropped, the flat portion of the display apparatus 1 is severely deformed and thus may break. However, when the display module 40 is installed above the main body 10 with the bracket 30 therebetween, the display module 40 may be firmly fixed to the bracket 30, such that strength of the display module 40 itself may be improved.

Therefore, the display apparatus 1 may increase the strength of the flat portion of the display module 40. Also, the display module 40 and the bracket 30 may be separated from the main body 10 when the display module 40 is damaged or broken, and a new display module and a new bracket may be installed above the main body 10. The display apparatus 1 may be easily and quickly repaired because it may be easily disassembled.

Figure 5:
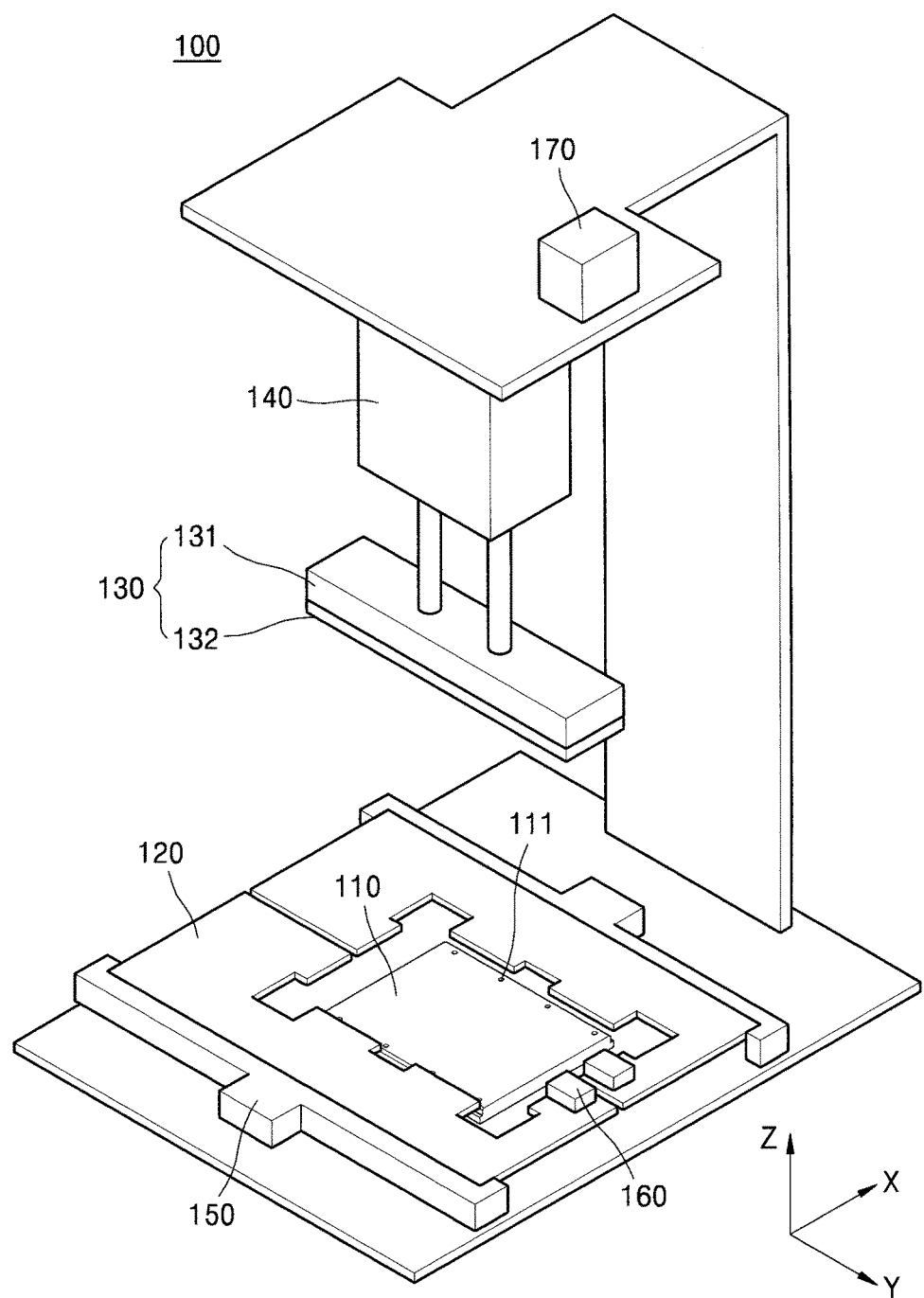
FIG. 5 is a perspective view of an apparatus for manufacturing a display apparatus that is used to manufacture the display module of FIG. 2.

FIG. 5 illustrates a perspective view of an apparatus 100 for manufacturing (e.g., a manufacturing apparatus 100) a display apparatus 1 that is used to manufacture the display module 40 of FIG. 2, and FIGS. 6A to 6C are diagrams for describing an order of manufacturing the display module 40 by using the apparatus 100 of FIG. 5 for manufacturing a display apparatus 1.

Referring to FIGS. 5, 6A, 6B, and 6C, the display module 40 may be manufactured by using the apparatus 100 for manufacturing a display apparatus 1. For example, the apparatus 100 for manufacturing a display apparatus 1 may include a first stage 110, a second stage 120, a force applicator (e.g., a force/power application unit) 130, a linear driver (e.g., a linear driving unit) 140, a stage driver (e.g., a stage driving unit) 150, an aligner (e.g., an alignment unit) 160, and a controller 170.

The bracket 30 may be located above the first stage 110. For example, the first stage 110 may include a fixture part 111 to which the connection part 32 of the bracket 30 is fixed. For example, the fixture part 111 may have a groove or a hole. In this case, the connection part 32 may be inserted into the fixture part 111 to be fixed thereto.

An opening may be at a central portion of the second stage 120. For example, the first stage 110 may be arranged in the opening of the second stage 120, and the first stage 100 may move relative to the second stage 120. For example, the first stage 110 and the second stage 120 may move in opposite directions. In another embodiment, one of the first stage 110 and the second stage 120 may be fixed, and the other of the first stage 110 and the second stage 120 may linearly move in a vertical direction with respect to the fixed stage.

The force applicator 130 may face the first stage 110 and the second stage 120. In this case, the force applicator 130 may linearly move, and thus may selectively contact the display module 40.

The force applicator 130 may be connected to the linear driver 140. The force applicator 130 may include a press body part 131, and may include an elastic part 132 installed above or below the press body part 131. In this case, the elastic part 132 may surround part of an external surface of the press body part 131, or may surround the entire external surface of the press body part 131. For example, the elastic part 132 may include synthetic resin, an elastic material such as rubber or silicon, or the like. As another example, the synthetic resin may include urethane.

A portion of the force applicator 130 that contacts the window 41 may be flat. Also, the force applicator 130 may be arranged above a central portion of the window 41. For example, respective distances between the force applicator 130 and a respective one of the round side surfaces of the window 41 may be identical.

The linear driver 140 may be connected to the force applicator 130, and may linearly move the force applicator 130. For example, the linear driver 140 may be in various forms. In an embodiment, the linear driver 140 may include a cylinder connected to the force applicator 130. In another embodiment, the linear driver 140 may include a ball screw connected to the force applicator 130, and a motor connected to the ball screw. In another embodiment, the linear driver 140 may include a linear motor connected to the force applicator 130. In this case, the linear driver 140 is not limited thereto, and may include all devices connected to the force applicator 130 for linearly moving the same. Hereinafter, for illustrative purposes, the linear driver 140 may include a cylinder.

The linear driver 140 may allow the force applicator 130 to be close to, or spaced apart from, the first stage 110 and the second stage 120. For example, the force applicator 130 may contact the display module 40 according to operations of the linear driver 140.

Similar to the linear driver 140, the stage driver 150 may be connected to, and may linearly move, at least one of the first stage 110 and the second stage 120. For example, the stage driver 150 may include a cylinder, a linear motor, a ball screw, a motor, etc. Hereinafter, for the purposes of illustration, the stage driver 150 may be connected to the second stage 120, and may move linearly.

The aligner 160 may protrude from the second stage 120. For example, the aligner 160 may be a protrusion, and may contact the end portions of the display module 40 and bracket 30, respectively, thereby supporting the alignment of the bracket 30 and the display module 40.

The controller 170 may be installed inside of or outside of the apparatus 100 for manufacturing a display apparatus 1. The controller 170 may come in various forms. For example, the controller 170 may include a circuit board. In another embodiment, the controller 170 may include a personal computer (PC), a laptop computer, or the like. In another embodiment, the controller 170 may include a portable terminal, such as a personal digital assistant (PDA) and a cell phone. Hereinafter, for the purposes of illustration, the controller 170 may include a circuit board installed inside the apparatus 100 for manufacturing a display apparatus 1.

With regard to a method of connecting the display module 40 to the bracket 30 by using the apparatus 100 for manufacturing a display apparatus 1, the bracket 30 and the display module 40 are manufactured first.

The bracket 30 may be above the first stage 110. For example, the connection part 32 of the bracket 30 may be completely inserted into a fixture part 111 to be fixed to the first stage 110. For example, when the initially manufactured bracket 30 is above the first stage 110, the end portions of the bracket 30 may contact the aligner 160, and thus, an initial location of the bracket 30 may be determined.

As described above, when the bracket 30 is installed above the first stage 110, the first stage 110 and the second stage 120 may be stepped. For example, an upper surface of the second stage 120 may be at a higher level than an upper surface of the first stage 110.

The display module 40 may be installed above the second stage 120. For example, the end portions of the display module 40 may contact the aligner 160, and thus, the display module 40 and the bracket 30 may be aligned relative to each other.

When the display module 40 and the bracket 30 are aligned relative to each other as described above, the controller 170 may operate the linear driver 140 and the stage driver 150 to couple the display module 40 to the bracket 30. The adhesive member 50 may be aligned between the display module 40 and the bracket 30. For example, the adhesive member 50 may be installed above any one of the display module 40 and the bracket 30, or may be installed above the bracket 30 after the bracket 30 is installed above the first stage 110. However, for the purposes of illustration, the bracket 30 may be installed above the adhesive member 50, and then the bracket 30 may be installed above the first stage 110.

Figure 6A:
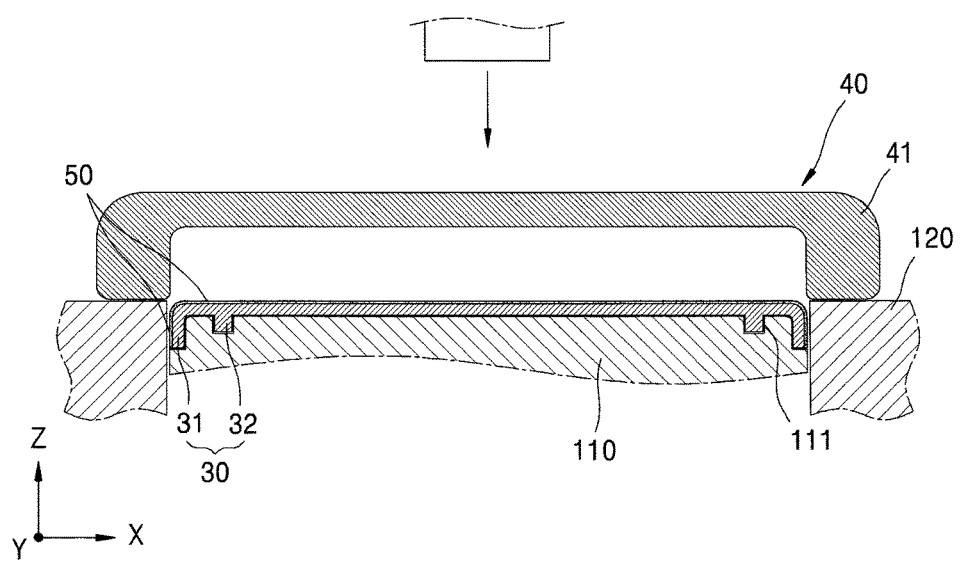
FIGS. 6A to 6C are diagrams for describing an order of manufacturing a display module by using the apparatus of FIG. 5 for manufacturing a display apparatus.
Figure 6B:
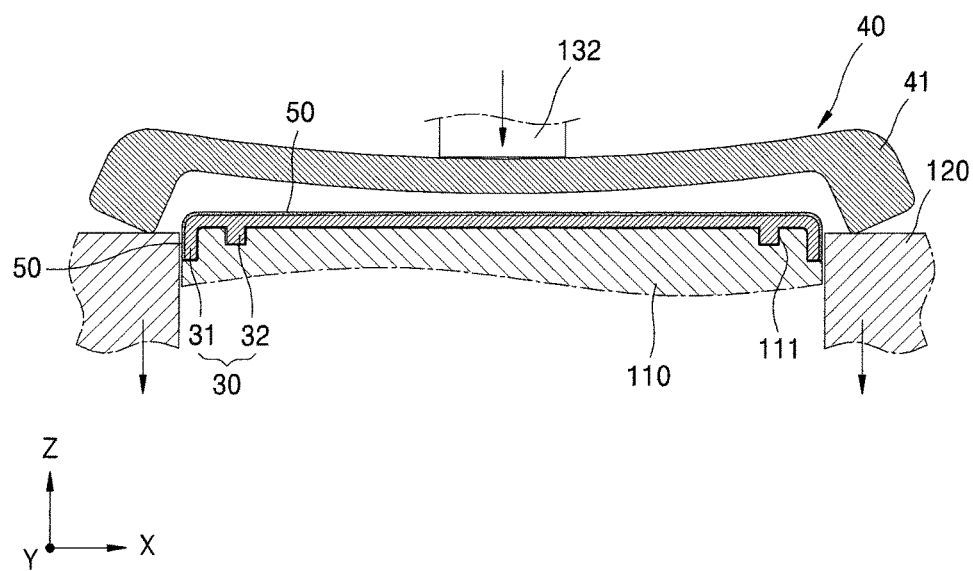

A process of coupling the display module 40 to the bracket 30 may include using the controller 170 to operate the linear driver 140, and to then couple the force applicator 130 to the display module 40. For example, the elastic part 132 may contact the display module 40. Also, the controller 170 may control the linear driver 140 in such a manner that the force applicator 130 applies force to the display module 40. A portion of the display module 40 may contact a portion of the adhesive member 50 or may come close thereto, the adhesive member 50 being installed above the bracket 30, due to the force applied by the force applicator 130. In addition, as a portion of the display module 40 moves towards the bracket 30, the round side surfaces of the display module 40 may move in the opposite direction (e.g., may bow outward, as shown in FIG. 6B). That is, a distance between the round side surfaces of the display module 40 may increase, as shown in FIG. 6B, in comparison with an initial distance therebetween, as shown in FIG. 6A.

While an inside of the display module 40 has a gap, the controller 170 may control the stage driver 150, and may move the first stage 110 and the second stage 120 relative to each other in such a manner that the first stage 110 (e.g., the upper surface of the first stage 110) is located higher than the second stage 120 (e.g., the upper surface of the second stage 120). For example, when the first stage 110 is fixed, the second stage 120 may descend. In another embodiment, when the second stage 120 is fixed, the first stage 110 may ascend. In another embodiment, the first stage 110 and the second stage 120 may move in opposite directions (e.g., the first stage 110 ascends while the second stage 120 descends). Hereinafter, for the purposes of illustration, the first stage 110 may be fixed, and the second stage 120 descends.

The controller 170 may control the linear driver 140, and may move the force applicator 130 or hold the force applicator 130 in place. The controller 170 may control a movement of the force applicator 130 to correspond to a movement of the second stage 120. For example, when the second stage 120 descends, the controller 170 may control the linear driver 140 such that the force applicator 130 descends.

Figure 6C:
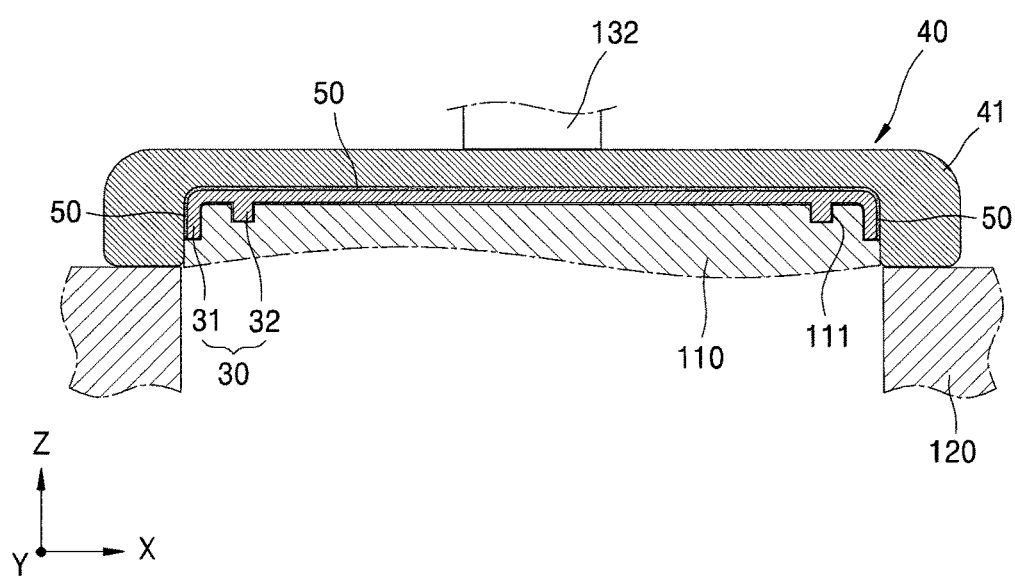

As described above, when the second stage 120 descends, a force for binding the round side surfaces of the display module 40 is alleviated, and the round side surfaces of the display module 40 may move toward each other due to a restoring force of the display module 40, as shown in FIG. 6C. For example, the bracket 30 may be installed within the display module 40, and thus, the display module 40 may totally surround an outer portion of the bracket 30. In the above case, the round side surfaces of the display module 40 may sequentially contact the adhesive member 50 due to the force applicator 130.

When the above process is completed, the controller 170 may control the linear driver 140, and may separate the force applicator 130 from the display module 40. Also, the controller 170 may control the stage driver 150 in such a manner that the first stage 110 and the second stage 120 are restored to their initial states. In this case, the display module 40 and the bracket 30 may be removed from the first stage 110 and the second stage 120. In another embodiment, after the first stage 110 and the second stage 120 are restored to their initial states, the display module 40 and the bracket 30 may be removed from the first stage 110 and the second stage 120. In the above case, the display module 40 and the bracket 30 may be transported to the outside/from the first and second stages 110 and 120 by a robot arm, etc.

After the above process is completed, the display module 40, to which the bracket 30 is fixed, may be coupled to the main body 10. According to a method of coupling the display module 40 to the main body 10, the display module 40 may be coupled to the main body 10 by a separate coupling member after the connection part 32 is inserted into the main body 10.

Therefore, according to the apparatus 100 for manufacturing a display apparatus 1, and the method of manufacturing the display apparatus 1, the display module 40 having the round side surfaces may be easily and quickly coupled to the bracket 30. Also, according to the apparatus 100 for manufacturing a display apparatus 1 and the method of manufacturing the display apparatus 1, the bracket 30 may be installed within the display module 40 without damaging the display module 40 having the round side surfaces. According to the apparatus 100 for manufacturing a display apparatus 1, and the method of manufacturing the display apparatus 1, product reliability and a defect ratio may be decreased by avoiding damage to the display module 40.

According to the one or more embodiments, a display apparatus may reduce or prevent damage to a window when the display apparatus is dropped. Also, because a display module is not directly coupled to a main body, the display module may be easily separated from the main body when the display module is damaged. The display module may be quickly coupled to a bracket.

It should be understood that embodiments described herein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope as defined by the following claims and their equivalents.

What is claimed is:

1. A display apparatus comprising:
   a display module;
   a bracket on the display module and comprising a bracket body in a grid form such that the bracket body defines an opening therethrough at a central portion thereof; and
   a main body connected to the bracket,
   wherein the display module comprises:
      a window with round side surfaces; and
      a display panel on the window, comprising pixels, having round side surfaces and a flat central portion, and located between the bracket and the window,
   wherein the bracket comprises:
      round side surfaces; and
      a flat central adjacent portion,
   wherein the round side surfaces of the bracket respectively contact the round side surfaces of the display panel,
   wherein the flat central adjacent portion of the bracket contacts the flat central portion of the display panel, and
   wherein an edge of the round side surfaces of the window protrudes more than an edge of the display panel in a direction away from the edge of the display panel.

2. The display apparatus of claim 1, wherein the display module further comprises a touch screen on the window or on the display panel.

3. The display apparatus of claim 1, wherein the display module further comprises a cushion part between the display panel and the bracket.

4. The display apparatus of claim 1, further comprising an adhesive member between the bracket and the display panel.

5. A display apparatus comprising:
   a display module with round side surfaces;
   a bracket on the display module and comprising a bracket body in a grid form such that the bracket body defines an opening in a plan view at a central portion thereof; and
   a main body connected to the bracket,
   wherein the display module comprises:
      a window with round side surfaces; and
      a display panel on the window, comprising pixels, having round side surfaces, and located between the bracket and the window,
   wherein an edge of the round side surfaces of the window protrudes more than an edge of the display panel in a direction away from the edge of the display panel,
   wherein the bracket further comprises a connection part on the bracket body comprising multiple protrusions that are each inserted into a corresponding hole defined by the main body, and
   wherein the bracket body is under the display panel.

* * * * *